(12) United States Patent
Choi et al.

(10) Patent No.: US 7,362,128 B2
(45) Date of Patent: Apr. 22, 2008

(54) PROGRAMMABLE IMPEDANCE CONTROL CIRCUIT IN SEMICONDUCTOR DEVICE AND IMPEDANCE RANGE SHIFTING METHOD THEREOF

(75) Inventors: Myung-Han Choi, Gyeonggi-do (KR); Young-Dae Lee, Gyeonggi-do (KR); Chul-Sung Park, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 417 days.

(21) Appl. No.: 11/153,755

(22) Filed: Jun. 14, 2005

(65) Prior Publication Data

US 2005/0276126 A1 Dec. 15, 2005

(30) Foreign Application Priority Data

Jun. 14, 2004 (KR) ...................... 10-2004-0043416

(51) Int. Cl.
   *H03K 17/16* (2006.01)
(52) U.S. Cl. ....................................................... 326/30
(58) Field of Classification Search ............. 326/30.26, 326/27, 31, 32, 34
   See application file for complete search history.

(56) References Cited

U.S. PATENT DOCUMENTS

| | | | |
|---|---|---|---|
| 5,606,275 A | 2/1997 | Farhang et al. | |
| 6,307,424 B1 * | 10/2001 | Lee | 327/530 |
| 6,456,124 B1 | 9/2002 | Lee et al. | |
| 7,288,966 B2 * | 10/2007 | Choi et al. | 326/83 |
| 2002/0050838 A1 * | 5/2002 | Kim et al. | 326/30 |
| 2004/0021481 A1 | 2/2004 | Ohno | |
| 2006/0158216 A1 * | 7/2006 | Aoyama et al. | 326/30 |

* cited by examiner

*Primary Examiner*—Rexford Barnie
*Assistant Examiner*—Thienvu V Tran
(74) *Attorney, Agent, or Firm*—Marger Johnson & McCollom, P.C.

(57) ABSTRACT

A programmable impedance control circuit for use in a semiconductor device having an impedance range shifting function prevents or substantially reduces an impedance detection failure based on an environment change. An impedance detector includes a first array driver, a second array driver, and an impedance matching transistor array and a range shifting transistor array independently controlled by the first and second array drivers. A comparator each compares first and second output voltage levels of the impedance detector with an array reference voltage, and outputs an up/down signal as the comparison result. A counter performs an up/down counting in response to the up/down signal, and outputs control code data. A range shifting circuit monitors a counting output of the counter and so generates range shifting data. Whereby, even if there is an environment change on a manufacturing process, power source voltage or operating temperature, etc., an impedance matching and correction operation can be performed without a waste of impedance matching transistor array and control code.

9 Claims, 14 Drawing Sheets

FIG. 1A (PRIOR ART)

| code | binary | gray | 25°C up | 25°C down | 80°C up | 80°C down | 130°C up | 130°C down |
|---|---|---|---|---|---|---|---|---|
| 0 | 000 0 | 0000000 0 | 54.55 | 54.23 | 63.08 | 63.3 | 70.65 | 71.57 |
| 1 | 000 1 | 0000000 1 | 51.64 | 51.18 | 59.39 | 59.71 | 66.21 | 67.47 |
| 2 | 001 0 | 0000001 0 | 49.02 | 48.62 | 56.11 | 56.42 | 62.28 | 63.54 |
| 3 | 001 1 | 0000001 1 | 46.66 | 46.15 | 53.18 | 53.55 | 58.81 | 60.29 |
| 4 | 010 0 | 0000011 0 | 44.52 | 44.05 | 50.53 | 50.89 | 55.69 | 57.14 |
| 5 | 010 1 | 0000011 1 | 42.56 | 42.02 | 48.14 | 48.55 | 52.89 | 54.49 |
| 6 | 011 0 | 0000111 0 | 40.77 | 40.27 | 45.96 | 46.35 | 50.35 | 51.9 |
| 7 | 011 1 | 0000111 1 | 39.12 | 38.57 | 43.97 | 44.4 | 48.06 | 49.71 |
| 8 | 100 0 | 0001111 0 | 37.6 | 37.1 | 42.15 | 42.56 | 45.95 | 47.55 |
| 9 | 100 1 | 0001111 1 | 36.2 | 35.64 | 40.47 | 40.9 | 44.03 | 45.7 |
| 10 | 101 0 | 0011111 0 | 34.89 | 34.37 | 38.92 | 39.33 | 42.26 | 43.87 |
| 11 | 101 1 | 0011111 1 | 33.68 | 33.12 | 37.49 | 37.92 | 40.63 | 42.29 |
| 12 | 110 0 | 0111111 0 | 32.55 | 32.03 | 36.15 | 36.56 | 39.11 | 40.72 |
| 13 | 110 1 | 0111111 1 | 31.49 | 30.94 | 34.91 | 35.34 | 37.71 | 39.36 |
| 14 | 111 0 | 1111111 0 | 30.49 | 29.98 | 33.75 | 34.16 | 36.41 | 37.99 |
| 15 | 111 1 | 1111111 1 | 29.57 | 29.03 | 32.67 | 33.09 | 35.19 | 36.8 |

FIG. 1B (PRIOR ART)

| code | binary | gray | 25°C up | 25°C down | 80°C up | 80°C down | 130°C up | 130°C down |
|---|---|---|---|---|---|---|---|---|
| 0 | 000 0 | 0000000 0 | 52.45 | 49.35 | 59.59 | 57.47 | 65.76 | 64.89 |
| 1 | 000 1 | 0000000 1 | 50.58 | 47.65 | 57.27 | 55.48 | 63.02 | 62.64 |
| 2 | 001 0 | 0000001 0 | 48.84 | 45.87 | 55.13 | 53.29 | 60.49 | 60.06 |
| 3 | 001 1 | 0000001 1 | 47.21 | 44.40 | 53.14 | 51.58 | 58.16 | 58.12 |
| 4 | 010 0 | 0000011 0 | 45.69 | 42.86 | 51.29 | 49.67 | 56.00 | 55.89 |
| 5 | 010 1 | 0000011 1 | 44.26 | 41.57 | 49.56 | 48.18 | 54.00 | 54.22 |
| 6 | 011 0 | 0000111 0 | 42.93 | 40.22 | 47.94 | 46.51 | 52.13 | 52.27 |
| 7 | 011 1 | 0000111 1 | 41.66 | 39.08 | 46.43 | 45.21 | 50.39 | 50.80 |
| 8 | 100 0 | 0001111 0 | 40.47 | 37.88 | 45.01 | 43.73 | 48.76 | 49.09 |
| 9 | 100 1 | 0001111 1 | 39.35 | 36.87 | 43.68 | 42.58 | 47.23 | 47.79 |
| 10 | 101 0 | 0011111 0 | 38.29 | 35.80 | 42.42 | 41.27 | 45.80 | 46.27 |
| 11 | 101 1 | 0011111 1 | 37.28 | 34.90 | 41.23 | 40.23 | 44.45 | 45.12 |
| 12 | 110 0 | 0111111 0 | 36.33 | 33.94 | 40.10 | 39.06 | 43.18 | 43.76 |
| 13 | 110 1 | 0111111 1 | 35.42 | 33.12 | 39.04 | 38.14 | 41.98 | 42.73 |
| 14 | 111 0 | 1111111 0 | 34.55 | 32.26 | 38.03 | 37.09 | 40.84 | 41.51 |
| 15 | 111 1 | 1111111 1 | 33.73 | 31.52 | 37.07 | 36.25 | 39.77 | 40.58 |

PROGRAMMABLE IMPEDANCE CONTROL CIRCUIT IN SEMICONDUCTOR DEVICE AND IMPEDANCE RANGE SHIFTING METHOD THEREOF

CROSS REFERENCE TO RELATED APPLICATIONS

This application claims priority from Korean Patent Application No. 2004-43416, filed on Jun. 14, 2004, the contents of which are hereby incorporated by reference for all purposes.

BACKGROUND

1. Field of the Invention

The disclosure relates to an impedance control field of semiconductor device, and more particularly, to a programmable impedance control circuit for automatically correcting an impedance mismatching.

2. Description of the Related Art

Typically, semiconductor devices include input and output (I/O) pins for transmitting data from/to the outside world, and a data output circuit such as data output buffer and driver circuit, to provide internal data to the outside world. In integrating the semiconductor devices into electrical appliances, pins are connected to transmission lines such as a printed wiring, etc. on a mounting substrate. These pins are needed to charge and discharge a floating capacitance or load capacitance as a parasitic capacitance existing on the mounting substrate. In this case, to appropriately transmit an output signal, an output impedance and an impedance of transmission line must be matched with each other, and to receive an input signal without distortion, an impedance of transmission line must be matched with an input impedance. The former is generally referred to as output impedance (ZQ) control, and the latter is referred to as chip termination (ZT) control. Generally, output impedance control is performed for an output driver and chip termination control is performed for an input terminator circuit.

In accordance with a trend toward higher operating speed of electrical appliances, a swing width of signals interfaced between semiconductor devices is getting reduced gradually, so as to substantially reduce a delay time taken in a signal transfer. However, the gradually-reduced signal swing width increases the influence of external noise, reducing signal-to-noise ratio. Furthermore, a reflection of output signal due to impedance mismatching at an interface terminal becomes critical. The impedance mismatching can be caused by external noise or changes of power source voltage, operating temperature and manufacturing process, etc. When impedance mismatching is caused by a non-smooth execution of output impedance ZQ control at an output terminal, an output signal from a semiconductor device may be distorted. If any semiconductor device receives the distorted output signal through an input terminal, a setup/hold fail or an input-level decision error, etc. may be caused.

In general, some semiconductor memory devices have employed an impedance control scheme to obtain an input/output impedance matching with external semiconductor devices. An example of programmable impedance control (PIC) circuit for performing such a programmable impedance control is disclosed in U.S. Pat. No. 6,307,424.

To execute an impedance control in an example of HSTL (High Speed Transceiver Logic) interface, a method using one extra pin is usually used to control to have a desired output impedance value within about a specification of decades of ohms ($\Omega$). In a semiconductor memory device employing such a method, it may be difficult to exactly obtain a desired output impedance value required intact, due to changes of power source voltage, operating temperature or manufacturing process, etc. To solve that difficulty, it is necessary to adaptively correct an impedance value. An example of prior art for such impedance control methods is disclosed in U.S. Pat. No. 6,456,124, and will be described together with a description of the invention.

Assuming that an impedance control operation is to be executed at a section of, e.g., 40 to 50 ohm, then a designer of the circuit extensively designs a transistor array of FIG. 2A so that an impedance detector 10 within a PIC circuit referred to in FIG. 3 has a range of about 30 to 60 ohm. This design is to accommodate a PVT (Process, Voltage, Temperature) change when the transistor array is designed larger than a section of actually executed impedance. However, even if the design margin described above is provided, there may be a case in which a low impedance is not detected in a condition of low power source voltage as shown in FIGS. 1A and 1B. In particular, in a low power source voltage condition of, e.g., 1.14 V and 130 (° C.), a low impedance of about 40 ohm might not be detected, as shown in FIG. 1B. That is, the PIC circuit employs a binary or gray code to turn on or off an impedance detection transistor array shown in FIG. 2A and so obtains a desired impedance value. But, in controlling an impedance by using the transistor array type, the impedance is not changed in a linear shape but in non-linear shape as shown in FIGS. 2B and 2C, in conformity with an increase/decrease of control codes. In FIGS. 2B and 2C, a transverse axis indicates a control code value and a vertical axis designates an impedance value of an ohm unit. Thus, in case a margin is provided to a low impedance side due to a PVT change, relatively many codes are not used, namely, wasted. In other words, an impedance detection resolution becomes worse within a desired section. The detection resolution directly influences a large or small size of detection range, thus the resolution is not so improved even though control codes to control a transistor array increase.

Hence, designers find it difficult to enhance reliability of PIC circuit by widening an impedance range because of several burdens, such as an increase of control codes and a chip occupation area based on an extension of the transistor array.

Consequently there is a need to develop an improved technique to smoothly perform an impedance matching operation without extension of the transistor array and waste of control codes even if there are environment changes in the manufacturing process, power source voltage and operating temperature, etc.

SUMMARY

According to the invention, some embodiments provide a programmable impedance control circuit for use in a semiconductor device, and an impedance range shifting method. The circuit and method prevent or substantially reduce an impedance detection failure caused by a change of peripheral environment such as process, power source voltage and temperature, etc., without an extension of impedance detection transistor array. An impedance range can be shifted automatically by a PVT condition change, and a relatively high impedance detection resolution can be obtained with the same number of control codes. In addition, there is no need to ensure an excessively large impedance detection range. The number of higher codes wasted by impedance moving non-linearly by a change of control code can be substantially reduced.

BRIEF DESCRIPTION OF THE DRAWINGS

The above and other features and advantages of exemplary embodiments will become readily apparent from the description that follows, with reference to the attached drawings in which:

FIGS. 1A and 1B each illustrate a general case and the worst case in performing an impedance detection per control code in a programmable impedance control circuit according to an example of the prior art;

DETAILED DESCRIPTION

Exemplary embodiments are more fully described in detail with reference to FIGS. 4 and 13 in which like components having like functions have been provided with like reference symbols and numerals. The invention may be embodied in many different forms and should not be construed as being limited to the exemplary embodiments set forth herein. Rather, these exemplary embodiments are provided so that this disclosure is thorough and complete, and to convey various aspects of the concept of the invention to those skilled in the art.

Figure 2A:
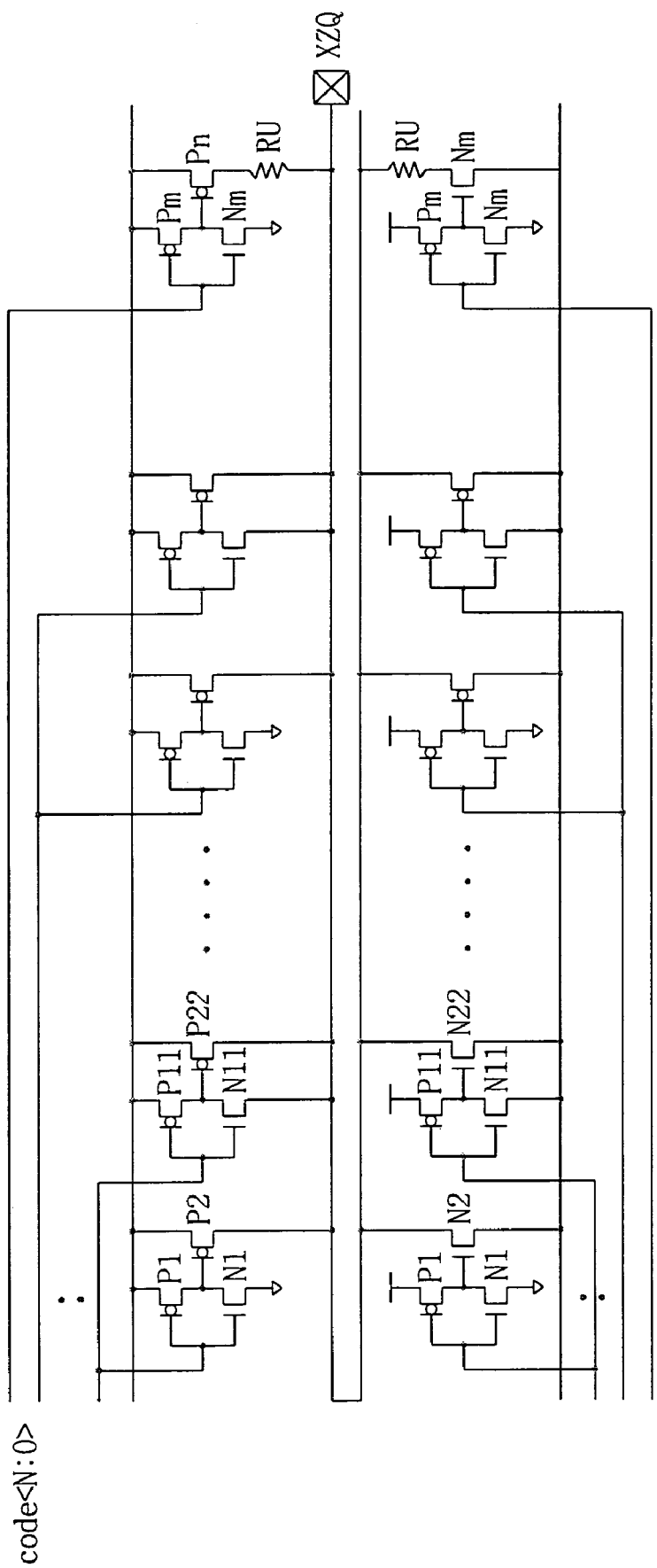
FIGS. 2A to 2C provide a non-linear characteristic of transistor array in a programmable impedance control according to an example of the prior art.
Figure 2B:
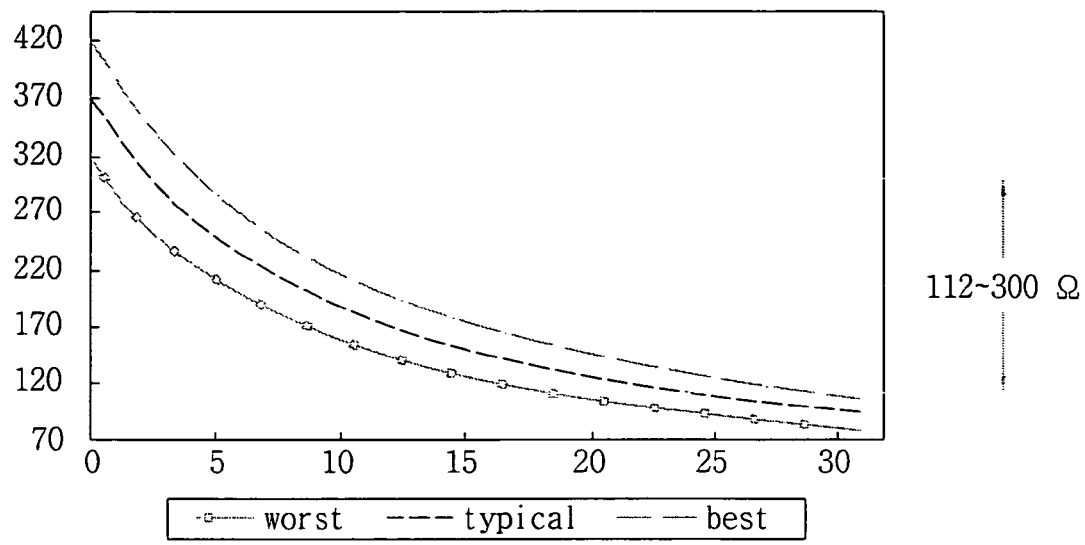
Figure 2C:
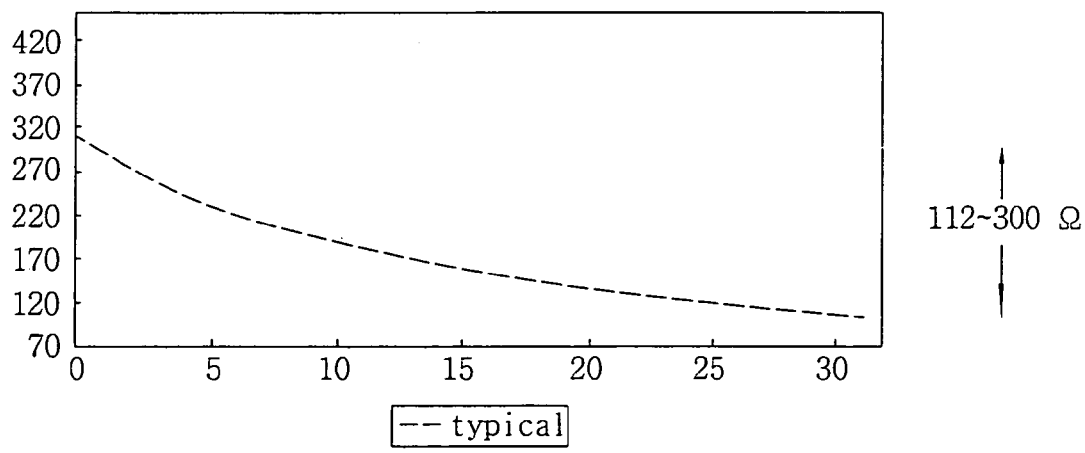
Figure 3:
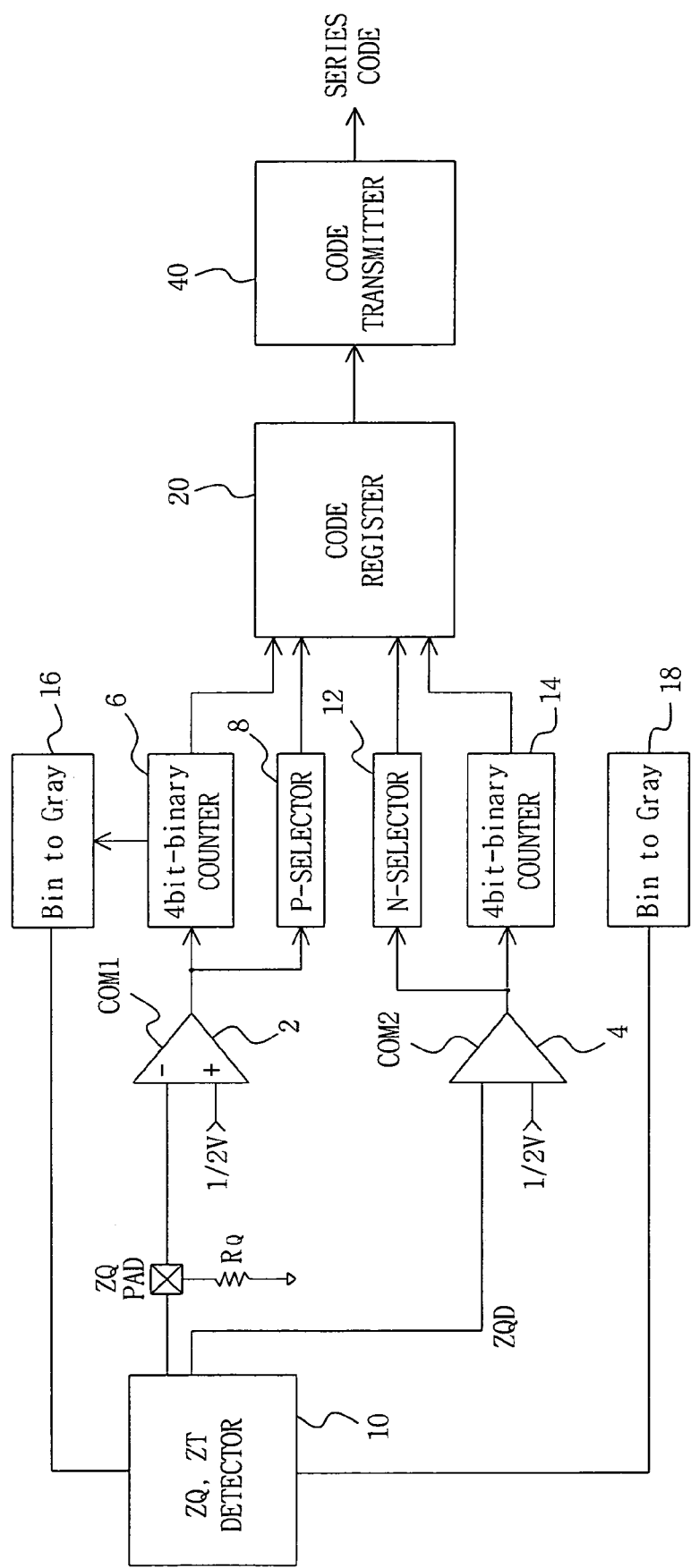
FIG. 3 is a block diagram of programmable impedance control circuit according to an example of the prior art.
Figure 4:
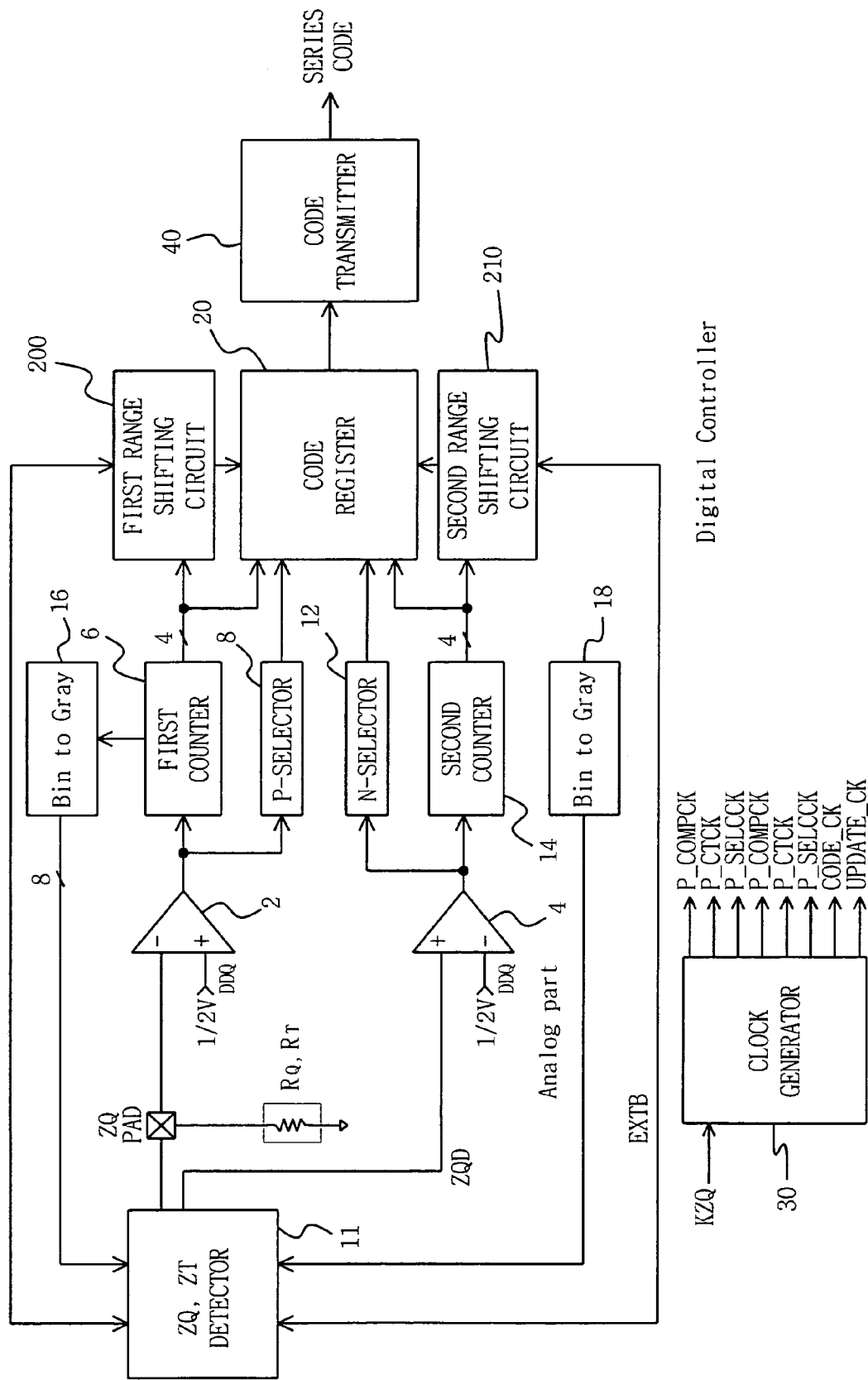
FIG. 4 is a block diagram of programmable impedance control circuit according to an exemplary embodiment of the invention.

FIG. 4 is a block diagram of programmable impedance control circuit according to an exemplary embodiment of the invention. In comparing the circuit of FIG. 4 with a general programmable impedance control circuit of FIG. 3, first and second range shifting circuits 200 and 210 are additionally installed, each corresponding to back sides of first and second counter in the circuit of FIG. 4. An internal configuration of ZQ, ZT detector 11 shown in FIG. 4 contain circuitry generally similar to an internal configuration of ZQ, ZT detector 10 shown in FIG. 3, and may further have a circuit configuration like FIG. 5 or 9.

Figure 5:
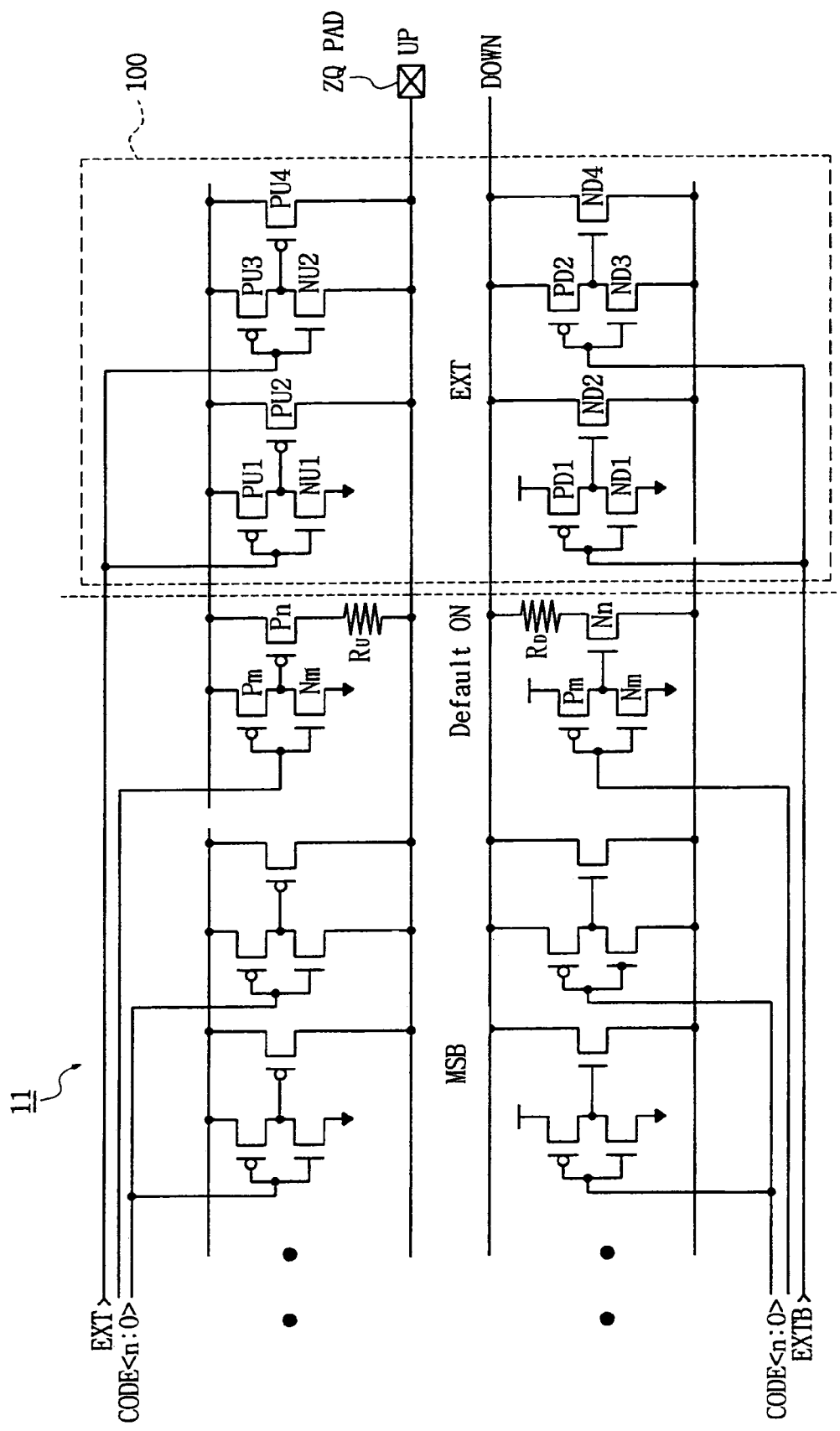
FIG. 5 is a circuit diagram illustrating an embodiment of an impedance detector shown in FIG. 4.
Figure 8:
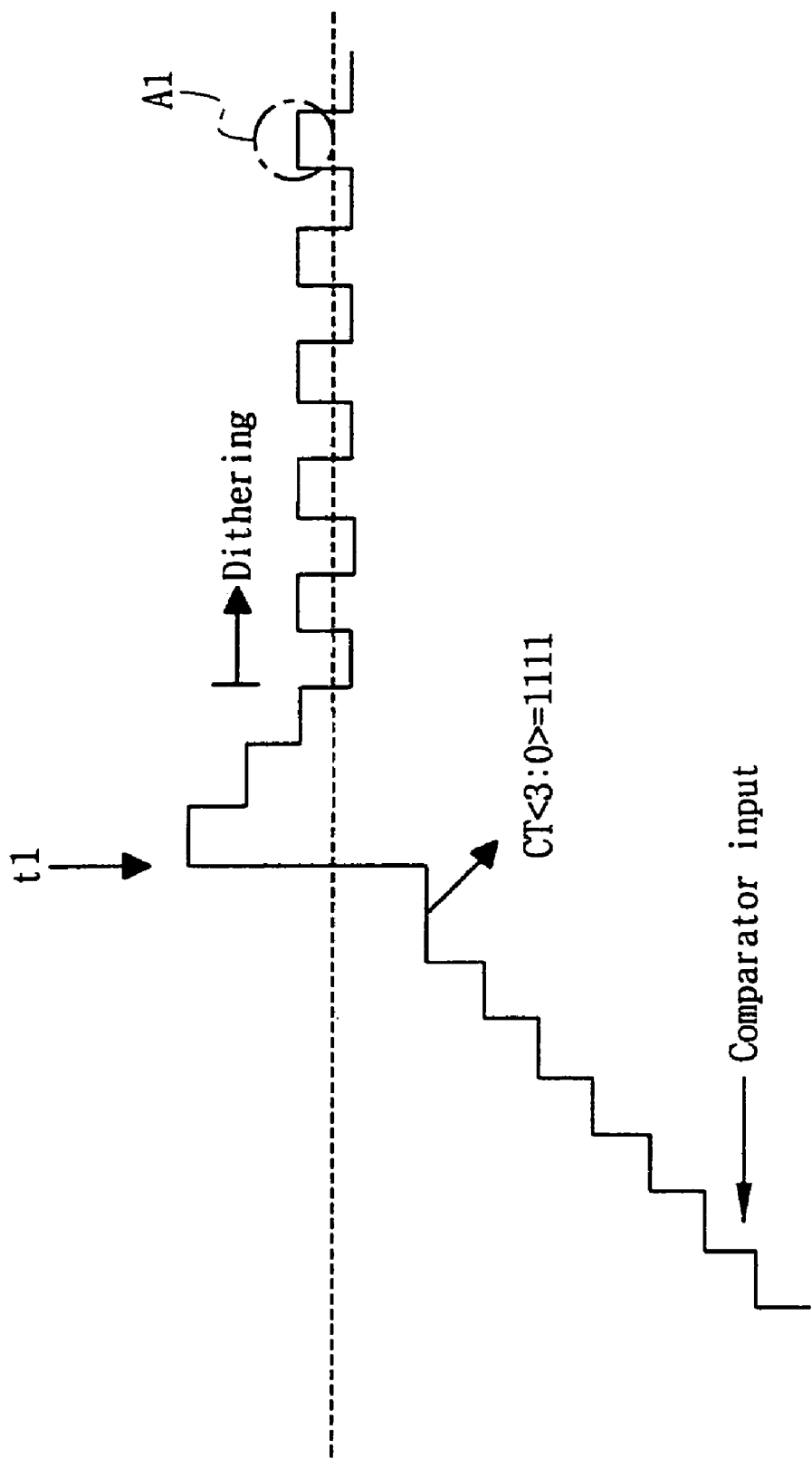
FIG. 8 illustrates a range shifting operation performed by a circuit of FIG. 4.

FIG. 5 is a circuit diagram illustrating an additional circuit configuration within the impedance detector 11 referred to in FIG. 4. Referring to FIG. 5, a range shifting array 100 constructed of P-type and N-type MOS (Metal Oxide Semiconductor) transistors is added. In FIG. 5, assuming that P-type and N-type MOS transistors Pm and Nm labeled for the convenience's purpose are called a first array driver, P-type and N-type MOS transistors Pn and Nn become an impedance matching transistor array. Assuming that P-type and N-type MOS transistors (PU1, NU1, PU3, NU2 and PD1, ND1, PD2, ND3) are called a second array driver, P-type and N-type MOS transistors (PU2, PU4, ND2 and ND4) become a range shifting transistor array. The second array driver responds to range shifting data EXT and EXTB for an impedance range shifting. A first output voltage level of the impedance detector 11 appears on a node connected to a pad ZQ PAD, and a second output voltage level appears on a down node DOWN. The range shifting array 100 responding to range shifting data EXT and EXTB for the impedance range shifting generally has an off state at a reset state. In other words, only in case an impedance locking is failed by a condition change of PVT, the range shifting array 100 is turned on and an impedance range is shifted. When one range shifting array 100 is employed as shown in FIG. 5, a range shifting operation to one direction, herewith, a low impedance locking, is performed as shown in FIG. 8.

Figure 6:
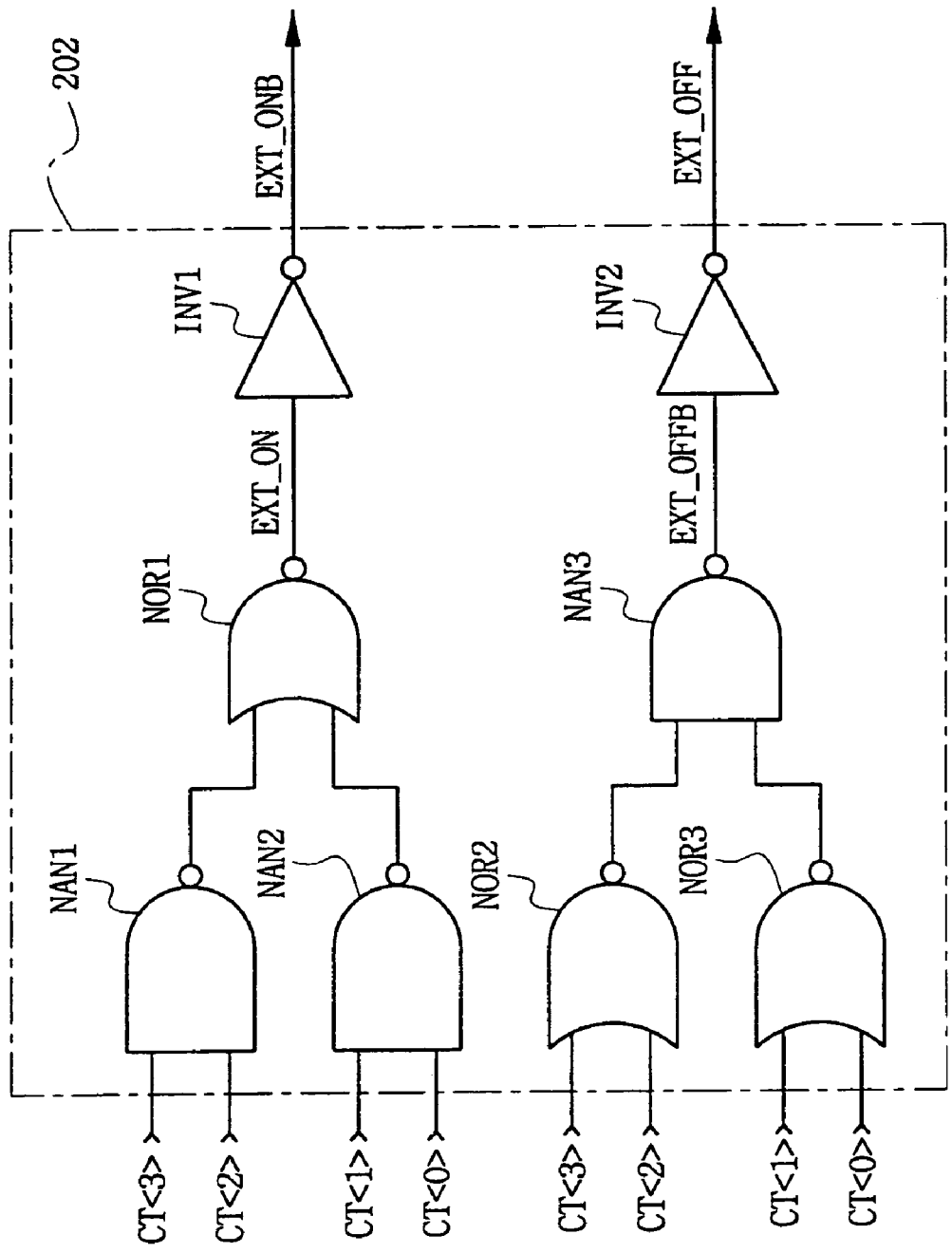
FIGS. 6 and 7 are circuit diagrams illustrating an example of the range shifting circuit shown in FIG. 4.
Figure 7:
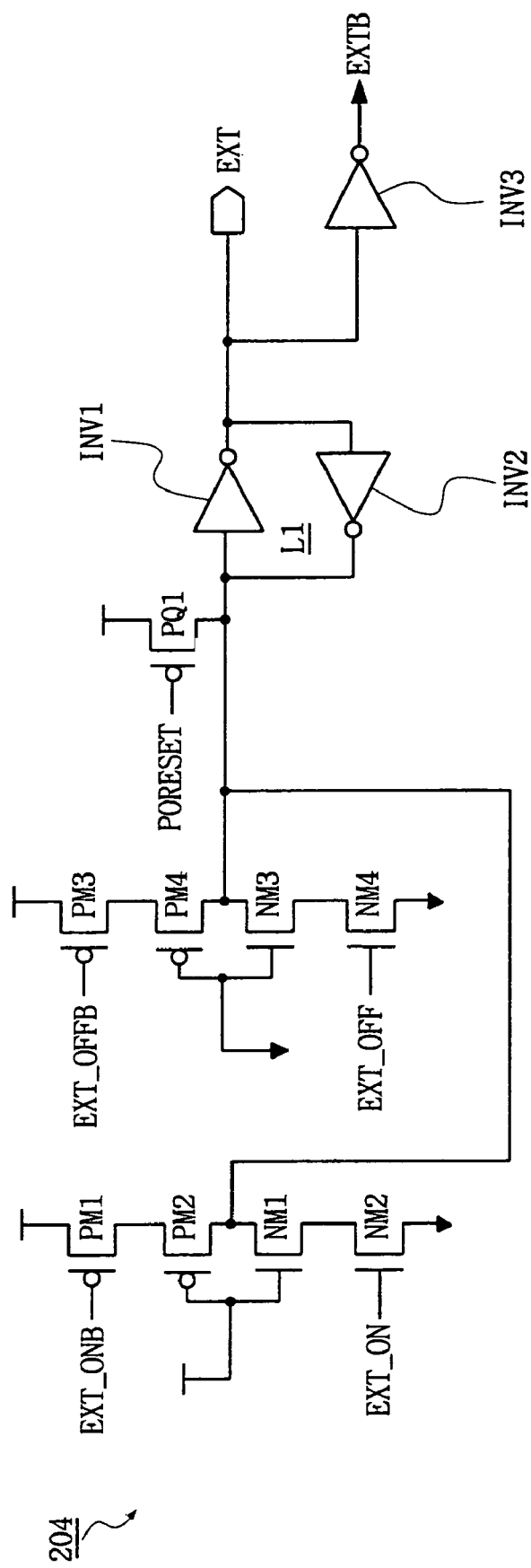

Examples of first and second range shifting circuits 200 and 210 shown in FIG. 4 are illustrated in FIGS. 6 and 7. FIGS. 6 and 7 partially individually illustrate examples of the range shifting circuit referred to in FIG. 4. Circuit configurations of a gating part of FIG. 6 coupled to a drive latch of FIG. 7 constitute one range shifting circuit, which provides the range shifting data EXT and EXTB to range shifting array 100 in FIG. 5.

Referring to FIG. 6, a gating part 202 performs a gating operation for a counting output logic of first or second counter 6 or 14 in FIG. 4. The gating part 202 includes NAND gates NAN1-NAN3, NOR gates NOR1-NOR3 and inverters INV1 and INV2, and has a wiring structure shown in FIG. 6. Thus, if all counting outputs are 1, in other words, if an impedance locking is failed, an extra on-signal EXT_ON is outputted as a logic high state.

With reference to FIG. 7, a drive latch 204 is exampled to generate the range shifting data EXT and EXTB in response to a gating output of the gating part 202. When the extra on-signal EXT_ON is provided as a logic high in the circuit of FIG. 6, an N-type MOS transistor NM2 is turned on, and an output of inverter INV1 constituting a latch L1 becomes a logic high. Thus, when all counting output logics of counter are 1 as a high state, range shifting data EXT for the impedance range shifting is outputted as a logic high.

When the range shifting data EXT is outputted as logic high, the range shifting array 100 of FIG. 5 is turned on at a time point t1 shown in FIG. 8 and a range shifting is performed. Then, a dithering is performed, and a new impedance matching is generated in response to a PVT change, as shown in a pulse code A1 of FIG. 8. FIG. 8 illustrates a range shifting provided by a circuit operation of FIG. 4, and provides an example for an impedance matching to a level of half power source voltage VDDQ/2.

Functions and operations in comparators 2 and 4, first and second counters 6 and 14, a P selector 8, an N selector 12 and binary-gray code converters 16 and 18, a code register 20, a clock generator 30 and a code transmitter 40 which are shown in FIG. 4, are equal or similar to that of a general programmable impedance control circuit; thus, the circuit of the invention can be used as a general circuit device.

Figure 9:
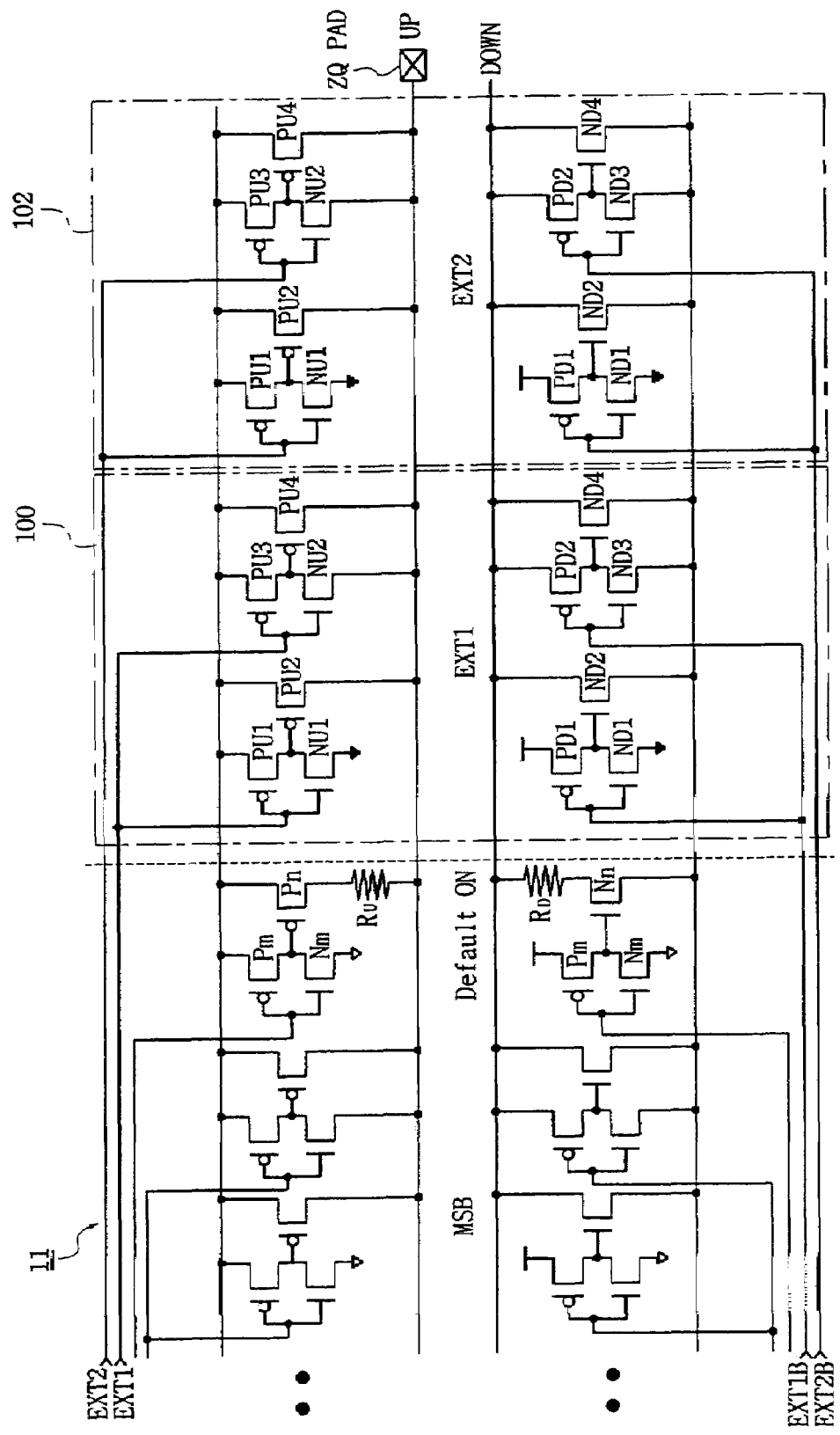
FIG. 9 is a circuit diagram illustrating another embodiment of an impedance detector of FIG. 4.

FIG. 9 illustrates another additional configuration within an impedance detector of FIG. 4, to perform a range shifting to both directions.

Referring to FIG. 9, first and second range shifting arrays 100 and 102 constructed of P-type and N-type MOS transistors are added. The first range shifting array 100 has the same configuration as FIG. 5 described above. A configuration of the second range shifting array 102 is equal to that of the first range shifting array 100, but has a characteristic of on-state in a reset operation. The first and second range shifting arrays 100 and 102, responding to first and second range shifting data EXT1, EXT1B, EXT2 and EXT2B for an impedance range shifting each have an on state and an off state in a reset operation, and are each turned on or off only in case an impedance locking is failed by a condition change of PVT. Then, an impedance range is shifted in a low impedance locking direction or high impedance locking direction.

Figure 10:
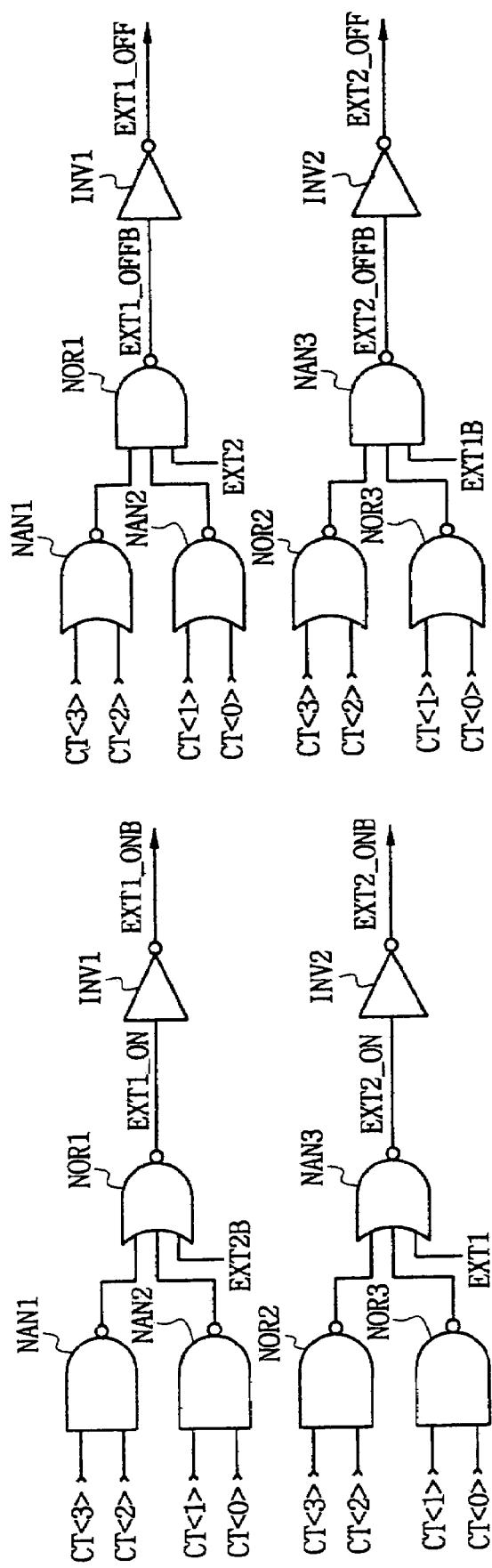
FIGS. 10 and 11 are circuit diagrams illustrating another example of the range shifting circuit shown in FIG. 4.
Figure 11:
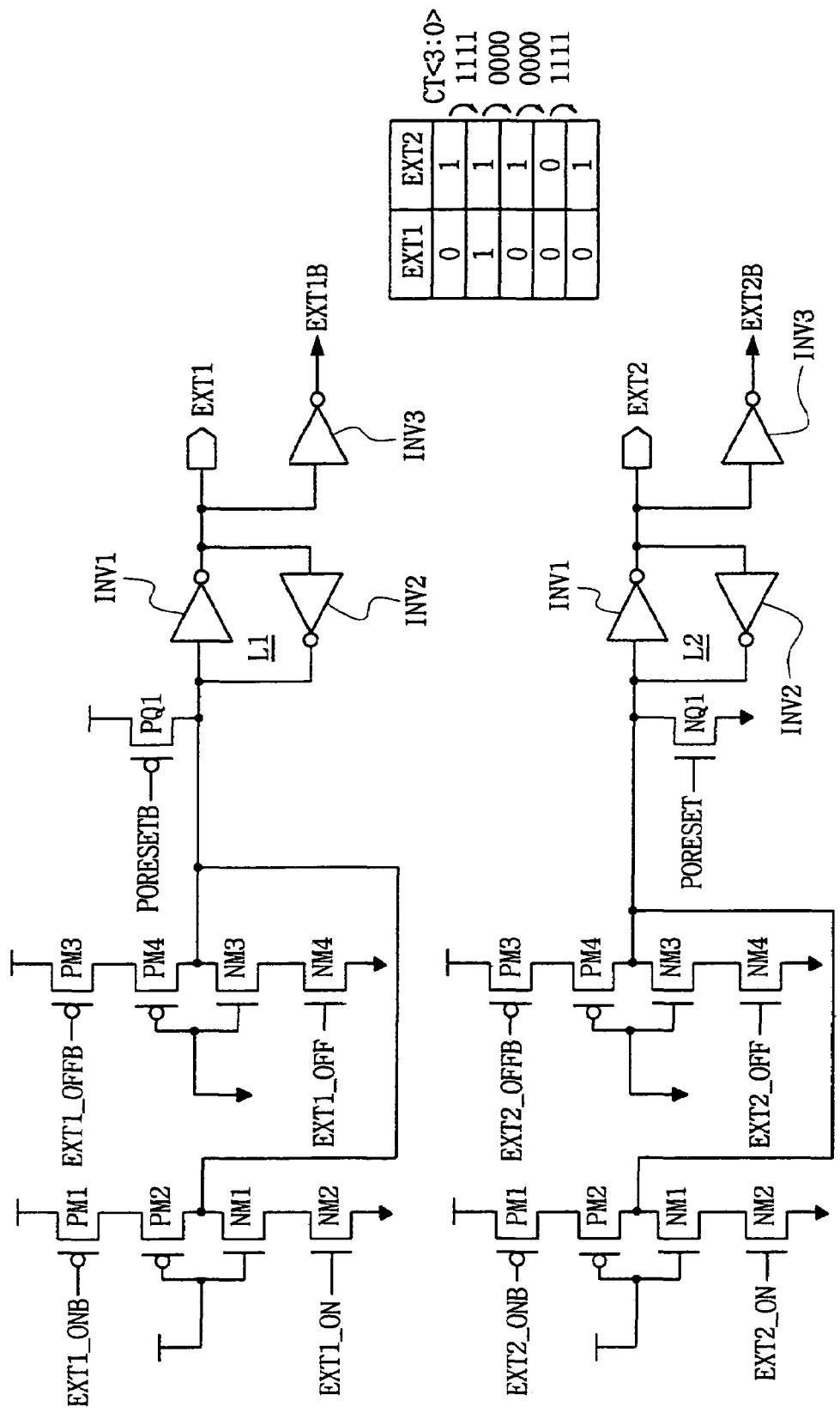

FIGS. 10 and 11 illustrate examples of first and second range shifting circuits to control first and second range shifting arrays 100 and 102 shown in FIG. 9. FIGS. 10 and 11 are circuit diagrams partially individually illustrating an example of range shifting circuit shown in FIG. 4. A circuit configuration of gating part shown in FIG. 10 and a circuit configuration of drive latch shown in FIG. 11 constitute one range shifting circuit.

With reference to FIG. 10, a gating part performs a gating operation for a counting output logic. The gating part includes a plurality of NAND gates, a plurality of NOR gates and a plurality of inverters, and has a wiring structure shown in FIG. 10. Thus, if all counting outputs are 1, in other words, if an impedance locking is failed, first and second extra on-signals EXT1_ON, EXT2_ON are outputted as logic high.

With reference to FIG. 11, first and second drive latches generate first and second range shifting data EXT1, EXT1B, EXT2 and EXT2B in response to a gating output of the gating part. In the circuit of FIG. 11, a state change of first and second range shifting data EXT1 and EXT2 based on a counting output logic of counter is like in a logic table provided in the right side of the drawing.

Figure 12:
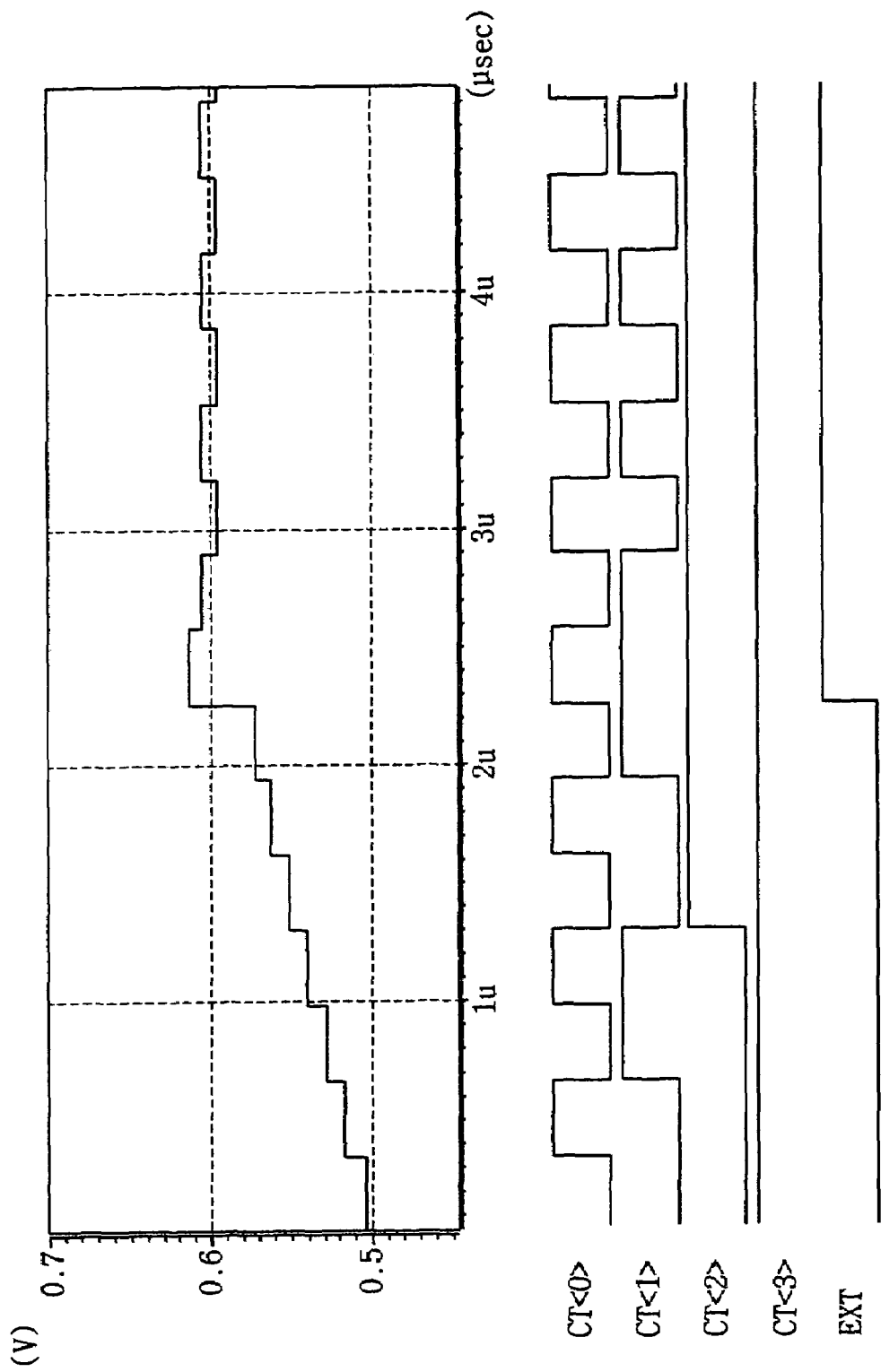
FIGS. 12 and 13 each illustrate simulation waveforms of low and high impedance locking by an operating control in FIG. 9.

When first range shifting data EXT1 is outputted as logic high, a range shifting shown in FIG. 12 is performed in a low impedance locking direction. FIG. 12 illustrates a simulation for a range shifting based on an operation of first range shifting array 100 shown in FIG. 9, as an example of impedance matching to a level of half power source voltage as about 0.6 V.

Figure 13:
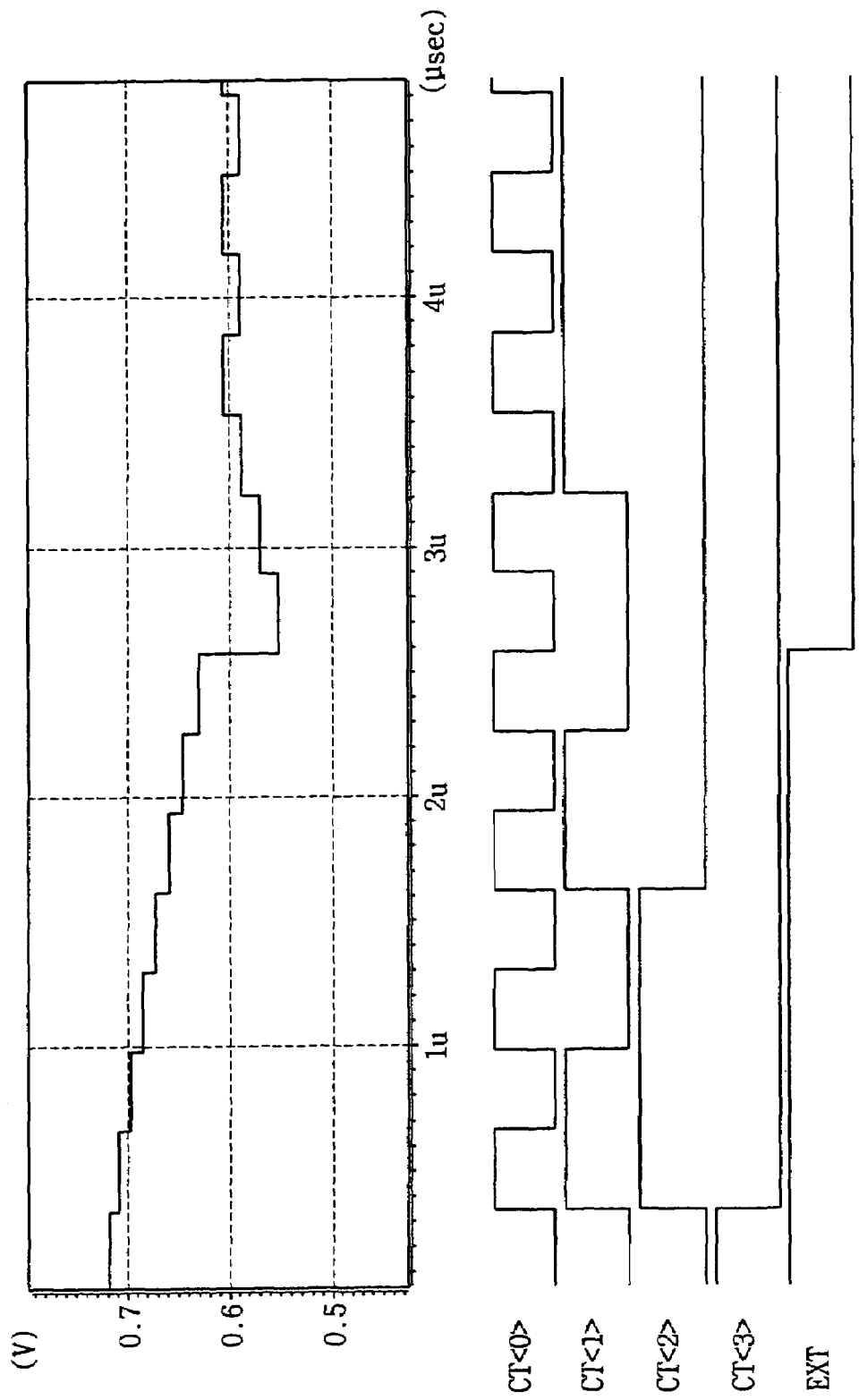

When second range shifting data EXT2 is outputted as logic low, a range shifting shown in FIG. 13 is performed in a high impedance locking direction. FIG. 13 illustrates a simulation for a range shifting based on an operation of second range shifting array 102 shown in FIG. 9, as an example of impedance matching to a level of half power source voltage as about 0.6 V.

An impedance range shifting will be generally described as follows, for more thorough understanding of the invention.

In a general detection procedure for a ZQ, ZT control, a voltage through a pad is compared with a reference voltage Vref in a comparator, and the result is applied to a counter. A transistor array within an impedance detector is turned on or off by an output of the counter, a logic of control code. For example, if a counter used for an impedance control of input terminator is a 5 bit binary counter, a detection range is designed in 32 sections. If an impedance locking does not occur because of a PVT change even though the counter continues to perform a counting operation, code cannot be transferred to the input terminator and an impedance matching is failed. Thus, a locking should be generated within a counting range of the counter and so there have been conventionally burdened to excessively extend a detection range.

Hence, according to an exemplary embodiment of the invention, a range shifting transistor block is added as one stage more to a transistor array of an impedance detector. Herewith, when the transistor array turns on, a circuit sizing operation is performed so that an impedance shifting is generated by a desired level, and this can be realized by different gate lengths of transistor.

A PIC circuit operates to increase a counting value of the counter one by one to search for a desired impedance, but in the worst case that a low impedance is outside the range, even though the counting value of the counter becomes 1111, a locking may not occur. In such a status, all output logics of 4 bit or 5 bit are AND gated and so an extra ON signal is generated and then a range shifting signal is generated. Then, this signal turns on a range shifting transistor added to the impedance detector so that a range shifting is performed. Next, the original transistor array operates again and a desired impedance value is found out. Conversely, when a locking does not occur in a state that a range shifting transistor is turned on, getting out of the worst case, a counting value of the counter goes down to 0000. At this time, 4 bit of the counter becomes OR, thus generating an extra off signal. This signal turns off a range shifting transistor. Likewise, procedures to search for a desired impedance are repeated again.

As described above, according to an exemplary embodiment of the invention, even if there is an environment change in a manufacturing process, power source voltage or operating temperature, etc., an impedance matching and correction operation can be performed without a waste of impedance matching transistor array and control code.

Accordingly, in employing a programmable impedance control circuit having a range shifting function in a semiconductor device or semiconductor memory device such as a static RAM (Random Access Memory), etc., a chip occupation area is reduced without influencing impedance detection resolution and operating performance of the device can be improved.

Embodiments of the invention may be practiced in many ways. What follows are exemplary, non-limiting descriptions of some of these embodiments.

According to an aspect of the invention, a programmable impedance control circuit for use in a semiconductor device includes an impedance detector, which includes a first array driver responding to control code data for an impedance control, a second array driver responding to range shifting data for an impedance range shifting, an impedance matching transistor array and a range shifting transistor array individually independently controlled by the first and second array drivers; a comparator for individually comparing first and second output voltage levels of the impedance detector with an array reference voltage and outputting an up/down signal as the comparison result; a counter for performing an up/down counting in response to the up/down signal, and outputting control code data for turning on or off P-channel and N-channel MOS transistors of the impedance matching transistor array; and a range shifting circuit for monitoring a counting output of the counter, generating the range shifting data if an impedance locking is failed, and applying it to the second array driver of the impedance detector.

The range shifting circuit may beneficially include a gating part for AND-gating a counting output logic of the counter and a drive latch for generating the range shifting data in response to a gating output of the gating part.

The counter may include a 4 bit binary counter to control an output impedance of the counter and may include a 5 bit binary counter for an input termination control.

A gray code converter for converting an output of the binary counter into a gray code may be additionally connected to the binary counter.

If the first output voltage level of the impedance detector has a level appearing on a common drain node of P-channel MOS transistors of the impedance matching transistor array, the second output voltage level may be a level appearing on a common drain node of N-channel MOS transistors of the impedance matching transistor array.

According to exemplary embodiments of the invention, an impedance matching and correction operation can be performed without a waste of impedance matching transistor array and control code even if there is an environment change in manufacturing process, power source voltage or operating temperature, etc. Thus, in employing a programmable impedance control circuit having a range shifting function in a semiconductor device or semiconductor memory device such as a static RAM, etc., a chip occupation area can be reduced and an operating performance of the device can be improved without lowering impedance detection resolution.

It will be apparent to those skilled in the art that modifications and variations can be made in the present invention without deviating from the spirit or scope of the invention. Thus, it is intended that the present invention cover any such modifications and variations of this invention within the scope of the appended claims and their equivalents. For example, the detailed configuration within a range shifting circuit may become different or may be replaced by an impedance detection and range shifting transistor array or other circuit device having the same or similar function. Accordingly, these and other changes and modifications are seen to be within the true spirit and scope of the invention as defined by the appended claims.

We claim:

1. A programmable impedance control circuit for use in a semiconductor device, the circuit comprising:

an impedance detector, which includes a first array driver responding to control code data for an impedance control, a second array driver responding to range shifting data for an impedance range shifting, an impedance matching transistor array and a range shifting transistor array controlled by the first and second array drivers;

a comparator for comparing first and second output voltage levels of the impedance detector with an array reference voltage, and outputting an up/down signal as the comparison result;

a counter for performing an up/down counting in response to the up/down signal, and outputting control code data for turning on or off transistors of the impedance matching transistor array; and a range shifting circuit for monitoring a counting output of the counter, generating the range shifting data when an impedance locking is failed, and applying the range shifting data to the second array driver of the impedance detector.

2. The circuit of claim 1, wherein the range shifting circuit comprises:

a gating part for gating a counting output logic of the counter; and a drive latch for generating the range shifting data in response to a gating output of the gating part.

3. The circuit of claim 2, wherein the gating part comprises an AND gate.

4. The circuit of claim 1, wherein the counter comprises a 4 bit binary counter.

5. The circuit of claim 1, wherein the counter comprises a 5 bit binary counter.

6. The circuit of claim 4, further comprising a gray code converter, which is connected to the binary counter and converts an output of the binary counter into gray code.

7. The circuit of claim 1 in which the transistors of the impedance matching transistor array comprises P-channel and N-channel transistors.

8. The circuit of claim 1, wherein if the first output voltage level of the impedance detector has a level appearing on a common drain node of the P-channel MOS transistors of the impedance matching transistor array, the second output voltage level has a level appearing on a common drain node of the N-channel MOS transistors of the impedance matching transistor array.

9. The circuit of claim 1 in which the impedance matching transistor array and range shifting transistor array are individually independently controlled by the first and second array drivers.

* * * * *